US009472962B2

(12) United States Patent
Brun-Buisson et al.

(10) Patent No.: US 9,472,962 B2
(45) Date of Patent: Oct. 18, 2016

(54) METHOD FOR BATTERY MANAGEMENT AND DIAGNOSIS

(75) Inventors: David Brun-Buisson, Vatilieu (FR); Henri Zara, Chamay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 214 days.

(21) Appl. No.: 14/115,951

(22) PCT Filed: May 7, 2012

(86) PCT No.: PCT/EP2012/058400
§ 371 (c)(1),
(2), (4) Date: Nov. 6, 2013

(87) PCT Pub. No.: WO2012/152770
PCT Pub. Date: Nov. 15, 2012

(65) Prior Publication Data
US 2014/0077764 A1 Mar. 20, 2014

(30) Foreign Application Priority Data
May 9, 2011 (FR) ...................... 11 53949

(51) Int. Cl.
*H02J 7/00* (2006.01)
*H01M 10/42* (2006.01)
(Continued)

(52) U.S. Cl.
CPC .......... *H02J 7/0024* (2013.01); *B60L 11/1857* (2013.01); *B60L 11/1866* (2013.01); *H01M 10/425* (2013.01); *H01M 10/441* (2013.01);
(Continued)

(58) Field of Classification Search
CPC ............................ H02J 7/0021; H02J 7/0014
USPC ......................................................... 320/117
See application file for complete search history.

(56) References Cited

U.S. PATENT DOCUMENTS 6,020,718 A    2/2000 Ozawa et al.
6,417,646 B1 * 7/2002 Huykman et al. ............ 320/122
(Continued)

FOREIGN PATENT DOCUMENTS

FR        2 750 507 A      1/1998
WO   WO 2006/112512 A    10/2006

*Primary Examiner* — Suchin Parihar
(74) *Attorney, Agent, or Firm* — Frommer Lawrence & Haug LLP

(57) ABSTRACT

Method for managing a battery comprising several accumulators that can be linked in series or in parallel, comprising a charging or discharging phase during which the accumulators are disposed in series, characterized in that it thereafter comprises a balancing phase comprising the placing of the accumulators in parallel, during which an electrical quantity $G_{min}$ representing the balancing of the accumulator that has attained the maximum voltage during the charging phase or minimum voltage during the discharging phase is measured or estimated, and during which an electrical quantity $G_i$ representing the balancing of another accumulator i of the battery is also measured or estimated, and in that the state of health $SOH_i$ of this other accumulator i is computed on the basis of the two electrical quantities $G_{min}$ and $G_i$ and on the basis of the knowledge of the performance of the accumulator i at the start of life.

10 Claims, 2 Drawing Sheets

(51) Int. Cl.
　　　*H01M 10/44*　　　(2006.01)
　　　*H01M 10/48*　　　(2006.01)
　　　*B60L 11/18*　　　(2006.01)
　　　*G01R 31/36*　　　(2006.01)
(52) U.S. Cl.
　　　CPC .............. *H01M 10/482* (2013.01); *H02J 7/00* (2013.01); *H02J 7/0014* (2013.01); *B60L 2240/547* (2013.01); *B60L 2240/549* (2013.01); *G01R 31/3658* (2013.01); *G01R 31/3679* (2013.01); *H01M 2010/4271* (2013.01); *Y02T 10/7005* (2013.01); *Y02T 10/7061* (2013.01)

(56) References Cited

U.S. PATENT DOCUMENTS

| | | | |
|---|---|---|---|
| 2005/0024015 A1* | 2/2005 | Houldsworth et al. | 320/119 |
| 2008/0072859 A1 | 3/2008 | Esaka et al. | |
| 2009/0104510 A1* | 4/2009 | Fulop et al. | 429/50 |
| 2010/0052615 A1* | 3/2010 | Loncarevic | 320/118 |
| 2010/0261048 A1* | 10/2010 | Kim et al. | 429/150 |
| 2011/0025258 A1* | 2/2011 | Kim et al. | 320/106 |
| 2012/0086400 A1* | 4/2012 | White et al. | 320/118 |

\* cited by examiner

METHOD FOR BATTERY MANAGEMENT AND DIAGNOSIS

This application is a 371 of PCT/EP2012/058400 filed on May 7, 2012, published on Nov. 15, 2012 under publication number WO 2012/152770, which claims priority benefits from French Patent Application Number 1153949 filed May 9, 2011, the disclosure of which is incorporated herein by reference.

The invention relates to a method for managing a battery, comprising especially the carrying out of the diagnosis of its various sub-assemblies. It also relates to a battery as such comprising an arrangement making it possible to implement this management method. Finally, it also relates to a battery management system implementing this battery management method.

Figure 1:
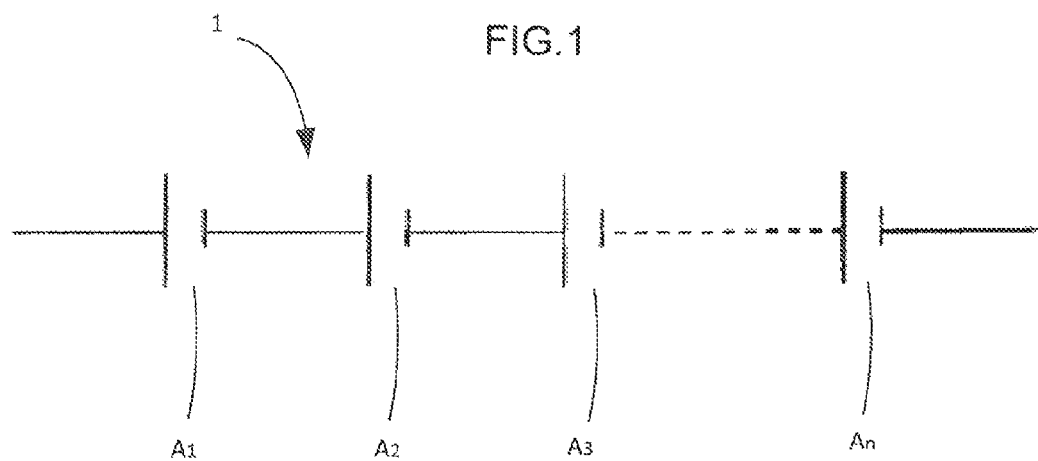

There exist accumulator batteries composed of a collection of several accumulators, disposed in series, so as to provide a sufficient output voltage in certain demanding applications, such as for powering a motor to propel an automotive vehicle. FIG. 1 thus schematically illustrates such a battery architecture 1, which comprises n accumulators $A_i$ disposed in series.

Document US2008072859 describes a battery whose architecture is of the above type, but which makes it possible moreover to dispose the various accumulators in series or in parallel, with the aid of switches inserted between the accumulators, driven by a dedicated electronic circuit. This solution allows the implementation of a balancing between the accumulators by disposing them in parallel, thereby giving rise to the automatic balancing of charge between the accumulators. This balancing of the various accumulators is carried out at the end of a charging period: it makes it possible to position the battery in an ideal configuration before its next use.

Prior art battery management calls upon an indicator, often referred to as "State Of Health", or more simply SOH, representative of the aging of a battery. This indicator is customarily used in the diagnosis of a battery.

The evaluation of this indicator is important for good control of the functioning of the battery, as well as in order to best manage the end of life thereof. The estimation of the SOH is carried out in a specific diagnosis operation during which the battery is not used. Moreover, the solutions advocated for carrying out this diagnosis are however not optimal.

Thus, a general object of the invention is to propose a solution for managing a battery which makes it possible to improve the carrying out of the diagnosis of the state of the battery, and more particularly the computation of its state of health SOH.

For this purpose, the invention relies on a method for managing a battery comprising several accumulators that can be linked in series or in parallel, comprising a charging or discharging phase during which the accumulators are disposed in series, characterized in that it thereafter comprises a balancing phase comprising the placing of the accumulators in parallel, during which an electrical quantity $G_{min}$ representing the balancing of the accumulator that has attained the maximum voltage during the charging phase or minimum voltage during the discharging phase is measured or estimated, and during which an electrical quantity $G_i$ representing the balancing of another accumulator i of the battery is also measured or estimated, and in that the state of health $SOH_i$ of this other accumulator i is computed on the basis of the two electrical quantities $G_{min}$ and $G_i$ and on the basis of the knowledge of the performance of the accumulator i at the start of life.

The method for managing a battery can comprise a preliminary step of total discharging or total charging and balancing of all the accumulators.

The state of health $SOH_i$ of the accumulator i can be computed as the ratio of its maximum capacity at the end of the battery balancing phase to its maximum capacity at the start of life and the two quantities ($G_{min}$; $G_i$) can be capacities (in A.h).

The method for managing a battery can comprise the following steps:

measurement or estimation of the capacity charged (X) during the charging phase or of the capacity discharged during the discharging phase;

measurement or estimation of the balancing charge ($X_{Emin}$) of the accumulator that has attained the maximum voltage at the end of the charging phase or the minimum voltage at the end of the discharging phase;

measurement or estimation of the balancing charge ($X_{Ei}$) of the accumulator i;

computation of the state of health $SOH_i$ of the accumulator i via the following formula:

$$SOH_i = \frac{(X + X_{Ei}) \times 100}{C_i(X + X_{Emin})/X}$$

Where $C_i$ represents the maximum capacity at the start of life of the accumulator i.

The method for managing a battery can comprise the following steps:

measurement of the charging or discharging current I passing through all the accumulators disposed in series and computation of the capacity charged (X) during the charging phase or of the capacity discharged during the discharging phase via the formula $X = \int I \, dt$ over the duration of the charging or discharging phase;

measurement of the balancing current $I_{Emin}$ at the level of the accumulator that has attained the maximum voltage at the end of the charging phase or the minimum voltage at the end of the discharging phase and computation of the balancing charge ($X_{Emin}$) during the balancing phase via the formula $X_{Emin} = \int I_{Emin} \, dt$ over the duration of the balancing phase;

measurement of the balancing current $I_{Ei}$ at the level of the accumulator i and computation of the balancing charge ($X_{Ei}$) during the balancing phase via the formula $X_{Ei} = \int I_{Ei} \, dt$ over the duration of the balancing phase.

The state of health $SOH_i$ of the accumulator i can be computed as the ratio of the maximum energy stored at the end of the battery balancing phase to its maximum energy stored at the start of life and the two quantities ($G_{min}$; $G_i$) can be energies.

The method for managing a battery can comprise a step of computing the state of health SOH of all the accumulators of the battery during the battery recharging and balancing or battery discharging and balancing phases.

The invention also pertains to a battery comprising several accumulators that can be connected in series or in parallel, characterized in that it comprises a computer which implements the management method such as described above.

The battery can comprise switches between different accumulators so as to dispose them in series or in parallel, at least one measurement sensor, a control circuit for the switches and a computer which receives the measurements and performs the computation of the state of health of at least one accumulator.

The invention also pertains to a system for managing a battery, characterized in that it comprises at least one computer which implements the method for managing a battery such as described above.

These subjects, characteristics and advantages of the present invention will be set forth in detail in the following description of a particular non-limiting embodiment offered in conjunction with the attached figures among which:

FIG. 1 schematically represents the architecture of a battery according to a prior art.

Figure 2:
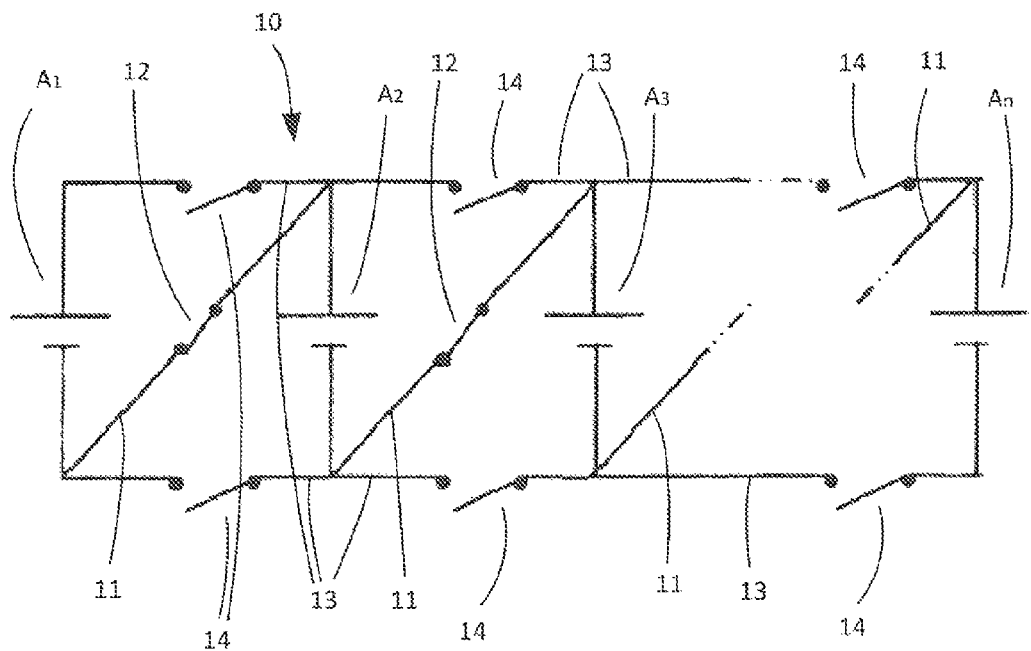

FIG. 2 schematically represents the architecture of a battery according to one embodiment of the invention in a series configuration.

Figure 3:
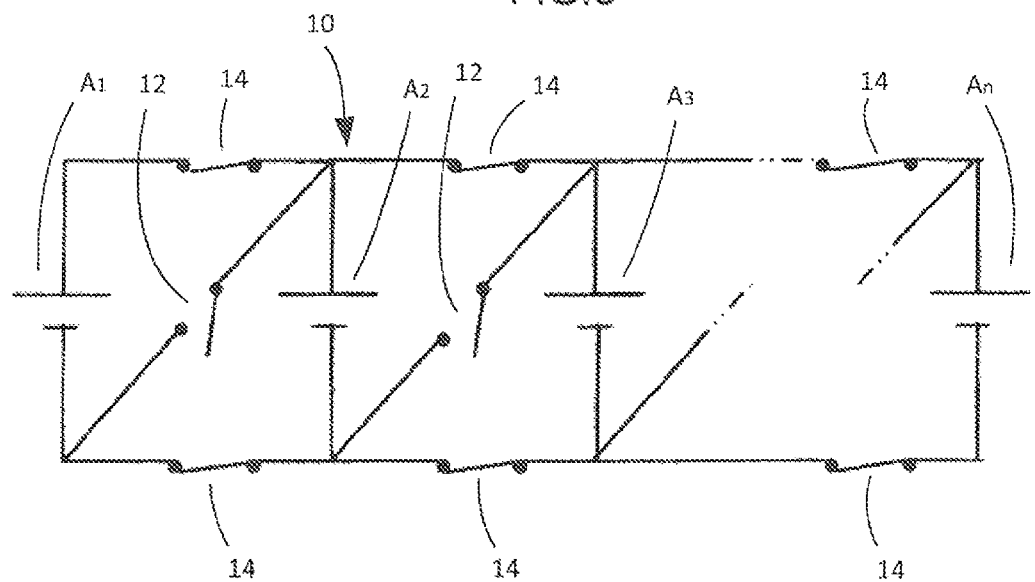

FIG. 3 schematically represents the architecture of a battery according to the embodiment of the invention in a parallel configuration.

Figure 4:
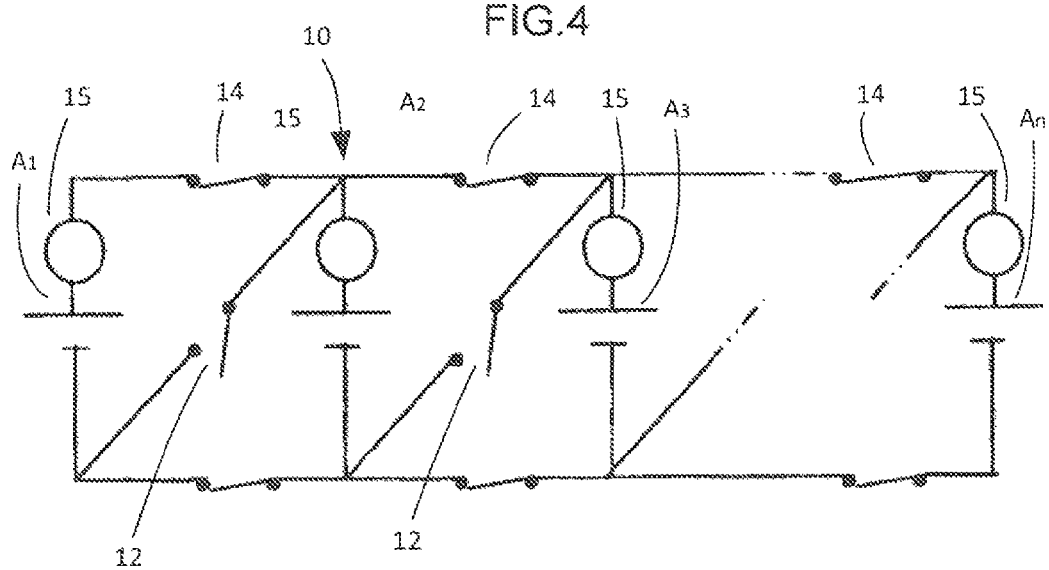

FIG. 4 represents more precisely the architecture of a battery according to the embodiment of the invention.

The method of the invention, an embodiment of which will be described hereinbelow, applies both during charging of a battery and during discharging. The embodiment which follows pertains to battery charging but it is easy to transpose it to the discharging of a battery.

FIG. 2 represents battery 10 according to a mode of execution of the invention, which comprises as previously the association of n accumulators $A_i$. The link between these accumulators comprises a first branch 11 disposed between their terminals of opposite sign, on which is disposed a first switch 12, that we will call "series switches". It thereafter comprises two other branches 13 connecting respectively their two terminals of identical sign and each comprising a switch 14, that we will call "parallel switch".

In FIG. 2, the series switches 12 are closed whereas the switches 14 are open, thereby making it possible to dispose the accumulators in series, according to a series configuration, equivalent to the diagram of FIG. 1.

Conversely, in FIG. 3, the series switches 12 are open whereas the switches 14 are closed, thereby making it possible to dispose the accumulators in parallel, according to a parallel configuration.

Such a battery architecture allows the implementation of a method for managing the battery which comprises its diagnosis and the computation of the state of health SOH of all its accumulators, which will now be described.

This method is implemented during the battery charging or discharging and balancing phases and exhibits the advantage of not requiring a distinct phase, which would immobilize the battery for an additional duration.

Indeed, according to a first step, the method comprises a step of computing the capacity charged in each accumulator during the battery charging phase, during which it is in a series configuration, that is to say all its accumulators receive the same constant charging current I. The charge X received by all the accumulators is therefore obtained via the following formula, integrated over the duration of this charging phase: $X = \int I \, dt$.

This charging phase terminates according to the conventional end-of-charging criteria, that is to say when an accumulator has attained the maximum voltage defined by its technology. At the end of charging, the various accumulators are generally in different conditions, the final voltage at their terminal being different, on account of their variable state, such as their different aging. This is why this charging phase is followed by a balancing phase. Accordingly, the battery is placed in a parallel configuration. The accumulators then tend naturally to an identical voltage, this being accompanied by a transfer of charge between them.

The method then comprises a second step of computing the capacity charged during this balancing phase. Accordingly, this balancing capacity charged $X_{Ei}$ for an accumulator i is computed via the following formula, computed over the duration of the balancing phase: $X_{Ei} = \int I_{Ei} \, dt$, where $I_{Ei}$ is the balancing current received or departing from the accumulator i (it will take a positive value in the case of charge reception and negative in the converse case).

During this balancing phase, the accumulator that has attained the highest voltage during the charging phase is the one which will discharge the most during the balancing phase. Denoting its balancing charge by $X_{Emin}$, it attains at the end of the balancing phase the charge state $SOC_E$ defined by the formula:

$$SOC_E = \frac{(X + X_{Emin}) \times 100}{X} \quad (1)$$

At the end of balancing, all the accumulators attain the same voltage and we will assume that they have all attained the same charge state. For the accumulator i, its maximum capacity $C_{maxi}$ at the given instant, at the end of the balancing phase, is therefore defined via the following formula:

$$C_{maxi} = \frac{(X + X_{Ei}) \times 100}{SOC_E} \quad (2)$$

The state of health $SOH_i$ of a particular accumulator i is computed as the ratio of its maximum capacity $C_{maxi}$ at a given instant to its maximum capacity Ci at the start of life, i.e. via the formula:

$$SOH_i = C_{maxi}/Ci * 100 \quad (3)$$

By integrating equations (1) and (2) into this equation (3), the state of health $SOH_i$ is ultimately obtained, in a third step of the method, via the following computation:

$$SOH_i = \frac{(X + X_{Ei}) \times 100}{C_i(X + X_{Emin})/X}$$

The method advantageously comprises a preliminary step of total charging or discharging and then of balancing of all the accumulators, so as to define a well known initial state serving as reference.

As a remark, the implementation of the above method is carried out, according to one embodiment, by measuring the currents flowing in all or some of the accumulators of the battery during at least the battery balancing phase. Accordingly, the battery can take the form illustrated by FIG. 4, in which a current sensor 15 is disposed in series with each accumulator $A_i$.

As a variant, this measurement of current can be estimated by any model or any other procedure.

The method implemented and described hereinabove exhibits the advantage of allowing simple and reliable computation of the state of health of all or some of the accumulators of a battery, simultaneously with a charging and balancing phase, without requiring additional immobilization of the battery, specific to its diagnosis.

The previous embodiment has been described by choosing to observe the charges involved so as to deduce therefrom a quantity representing the state of health SOH of an accumulator, as defined previously. As a remark, this state of health could also be evaluated by observing other electrical quantities, such as for example the powers offered by an accumulator, and therefore the energy stored and yielded, which decreases progressively with the aging of the battery. The implementation of this approach can be carried out on the basis of a battery such as represented in FIG. 4, and on the basis of the voltage and current measurements.

Thus, the above-described method of the invention can be implemented more generally by observing two electrical quantities $G_{min}$ and $G_i$ representing respectively the balancing of the accumulator that has attained the maximum voltage during charging phase and the same electrical quantity $G_i$ representing the balancing of a distinct particular accumulator i. The battery can then comprise any measurement sensor necessary for the knowledge of the chosen electrical quantity G.

The method has been described when charging a battery, during which the quantity Gmin represents the balancing of the accumulator that has attained the maximum voltage. This method can readily be transposed to the discharging of a battery, during which the quantity Gmin represents the balancing of the accumulator that has attained the minimum voltage during discharging.

The invention also pertains to a battery as such, taking the form illustrated in FIG. 4, and furthermore comprising a control circuit for its switches, as well as at least one computer for implementing the computations explained. These components can be internal to the battery. As a variant, all or some of the steps of the method can be carried out in an external unit of a battery diagnosis system.

The invention claimed is:

1. Method for managing a battery comprising several accumulators that are linked in series or in parallel, comprising a charging or discharging phase during which the accumulators are disposed in series, wherein the method thereafter comprises
   a balancing phase comprising the placing of the accumulators in parallel,
   measuring or estimating an electrical quantity $G_{min}$ representing the balancing of the accumulator that has attained the maximum voltage during the charging phase or minimum voltage during the discharging phase, and
   measuring or estimating an electrical quantity $G_i$ representing the balancing of another accumulator i of the battery,
   computing the state of health $SOH_i$ of the other accumulator i based on $G_{min}$ and $G_i$ and the knowledge of the performance of the accumulator i at the start of life.

2. Method for managing a battery according to claim 1, comprising a preliminary step of total discharging or total charging and balancing of all the accumulators.

3. Method for managing a battery according to claim 1, wherein the state of health $SOH_i$ of the accumulator i is computed as the ratio of its maximum capacity at the end of the battery balancing phase to its maximum capacity at the start of life and in that the two quantities $G_{min}$; $G_i$ are capacities (in Amp-Hours).

4. Method for managing a battery according to claim 3, comprising:
   measurement or estimation of the capacity charged X during the charging phase or of the capacity discharged during the discharging phase;
   measurement or estimation of the balancing charge $X_{Emin}$ of the accumulator that has attained the maximum voltage at the end of the charging phase or the minimum voltage at the end of the discharging phase;
   measurement or estimation of the balancing charge $X_{Ei}$ of the accumulator i;
   computation of the state of health $SOH_i$ of the accumulator i via the following formula:

$$SOH_i = \frac{(X + X_{Ei}) \times 100}{C_i(X + X_{Emin})/X}$$

Where $C_i$ represents the maximum capacity at the start of life of the accumulator i.

5. Method for managing a battery according to claim 4, comprising:
   measurement of the charging or discharging current I passing through all the accumulators disposed in series and computation of the capacity charged X during the charging phase or of the capacity discharged during the discharging phase via the formula $X = \int I \, dt$ over the duration of the charging or discharging phase;
   measurement of the balancing current $I_{Emin}$ at the level of the accumulator that has attained the maximum voltage at the end of the charging phase or the minimum voltage at the end of the discharging phase and computation of the balancing charge $X_{Emin}$ during the balancing phase via the formula $X_{Emin} = \int I_{Emin} \, dt$ over the duration of the balancing phase;
   measurement of the balancing current $I_{Ei}$ at the level of the accumulator i and computation of the balancing charge $X_{Ei}$ during the balancing phase via the formula $X_{Ei} = \int I_{Ei} \, dt$ over the duration of the balancing phase.

6. Method for managing a battery according to claim 1, wherein the state of health $SOH_i$ of the accumulator i is computed as the ratio of the maximum energy stored at the end of the battery balancing phase to its maximum energy stored at the start of life and in that the two quantities $G_{min}$; $G_i$ are energies.

7. Method for managing a battery according to claim 1, comprising a step of computing the state of health SOH of all the accumulators of the battery during the battery recharging and balancing or battery discharging and balancing phases.

8. Battery comprising several accumulators ($A_i$) that can be connected in series or in parallel, wherein the battery comprises a computer which implements the management method according to claim 1.

9. Battery according to claim 8, wherein the battery comprises switches between different accumulators ($A_i$) to dispose them in series or in parallel, at least one measurement sensor, a control circuit for the switches and a computer which receives the measurements and performs the computation of the state of health of at least one accumulator.

10. System for managing a battery, wherein the system comprises at least one computer which implements the method for managing a battery according to claim 1.

* * * * *